(12) United States Patent
Chen et al.

(10) Patent No.: US 8,513,774 B2
(45) Date of Patent: Aug. 20, 2013

(54) LOW-VOLTAGE STRUCTURE FOR HIGH-VOLTAGE ELECTROSTATIC DISCHARGE PROTECTION

(75) Inventors: Hsin-Liang Chen, Taipei (TW); Chan Wing Chor, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 64 days.

(21) Appl. No.: 12/899,181

(22) Filed: Oct. 6, 2010

(65) Prior Publication Data

US 2012/0086080 A1    Apr. 12, 2012

(51) Int. Cl.
*H01L 29/00* (2006.01)

(52) U.S. Cl.
USPC .............. 257/579; 257/E29.194; 257/E29.197

(58) Field of Classification Search
USPC .......... 257/355, 566, 579, E29.194, E29.197, 257/E29.264; 438/236, 342
See application file for complete search history.

(56) References Cited

U.S. PATENT DOCUMENTS 5,268,588 A * 12/1993 Marum ......................... 257/362
6,365,940 B1    4/2002 Duvvury et al.
7,081,662 B1    7/2006 Lee et al.
7,244,992 B2    7/2007 Ker et al.
7,719,026 B2    5/2010 Lou et al.

FOREIGN PATENT DOCUMENTS

| CN | 1601747 A | 3/2005 |
|---|---|---|
| CN | 1913148 A | 2/2007 |
| CN | 101286510 A | 10/2008 |

OTHER PUBLICATIONS

Office Action for Chinese Application No. 201010295879.9 dated Nov. 29, 2012.

* cited by examiner

*Primary Examiner* — Tucker Wright (74) *Attorney, Agent, or Firm* — Alston & Bird LLP (57) ABSTRACT

An electrostatic discharge (ESD) protected device may include a substrate, an N+ doped buried layer, an N-type well region and a P-type well region. The N+ doped buried layer may be disposed proximate to the substrate. The N-type well region may be disposed proximate to a portion of the N+ doped buried layer to form a collector region. The P-type well region may be disposed proximate to remaining portions of the N+ doped buried layer and having at least a P+ doped plate corresponding to a base region and distributed segments of N+ doped plates corresponding to an emitter region.

17 Claims, 7 Drawing Sheets

Conventional vertical BJT V.S. Small size low voltage structure

| Comparative item | Cell pitch (um) | Holding voltage (V) | Soft fail current ILeak (A) | Second breakdown trigger current It2 (A) |
|---|---|---|---|---|
| Improvement percentage | -40.17% | 20.37% | 57.86% | 25.05% |

FIG. 7.

LOW-VOLTAGE STRUCTURE FOR HIGH-VOLTAGE ELECTROSTATIC DISCHARGE PROTECTION

TECHNOLOGICAL FIELD

Embodiments of the present invention generally relate to semiconductor devices and, more particularly, relate to a low-voltage structure for high-voltage electrostatic discharge (ESD) protection.

BACKGROUND

There is currently an ongoing drive toward the downscaling of device dimensions in virtually all aspects of electronic device manufacture. Smaller electronic devices tend to be more popular than larger, more bulky devices when both devices have substantially equivalent capabilities. Accordingly, being able to fabricate smaller components would clearly tend to facilitate the production of smaller devices that incorporate those components. However, many modern electronic devices require electronic circuitry to perform both actuation functions (e.g., switching devices) and data processing or other decision making functions. The use of low-voltage complementary metal-oxide-semiconductor (CMOS) technologies for these dual functions may not always be practical. Thus, high-voltage (or high-power) devices have also been developed to handle many applications where low-voltage operation is not practical.

The electrostatic discharge (ESD) performance of typical high-voltage devices often depends on the total width and surface or lateral rules of the corresponding devices. Thus, ESD performance may typically be more critical for smaller devices. High-voltage devices typically have characteristics that include a low on-state resistance (Rdson), a high breakdown voltage and a low holding voltage. The low on-state resistance may tend to make an ESD current more likely to concentrate on the surface or the drain edge of a device during an ESD event. High current and high electric fields may cause the physical destruction at a surface junction region of such a device. Based on the typical requirement for a low on-state resistance, the surface or lateral rules likely cannot be increased. Thus, ESD protection may be a challenge.

The high breakdown voltage characteristic of high-voltage devices typically means that the breakdown voltage is higher than the operating voltage, and the trigger voltage (Vt1) is higher than the breakdown voltage. Accordingly, during an ESD event, the internal circuitry of the high-voltage device may be at risk of damage before the high-voltage device turns on for ESD protection. The low holding voltage characteristic of high-voltage devices also leaves open the possibility that unwanted noise associated with a power-on peak voltage or a surge voltage may be triggered or that a latch-up may occur during normal operation. High-voltage devices may also experience the field plate effect due to the fact that electric field distribution may be sensitive to routing so that ESD current may be likely to concentrate at the surface or drain edge during an ESD event.

To improve high-voltage device performance with respect to ESD events, one technique that has been implemented involves the additional use of masks and other processes to create a larger sized diode within bipolar junction transistor (BJT) components and/or increasing the surface or lateral rules for MOS transistors.

Accordingly, it may be desirable to develop an improved structure for providing ESD resistance.

BRIEF SUMMARY OF EXEMPLARY EMBODIMENTS

Some example embodiments are therefore directed to a low-voltage structure for high-voltage ESD protection. In some cases, the ESD protection may be provided at least in part based on modifications to a BCD (Bipolar Complimentary metal-oxide semiconductor (BiCMOS) Diffusion metal-oxide semiconductor (DMOS)) process that may involve an epi process.

In one exemplary embodiment, a high-voltage electrostatic discharge (ESD) protected device is provided ("exemplary" as used herein referring to "serving as an example, instance or illustration"). The high-voltage ESD protected device may include a substrate, an N+ doped buried layer, an N-type well region and a P-type well region. The N+ doped buried layer may be disposed proximate to the substrate. The N-type well region may be disposed proximate to a portion of the N+ doped buried layer to form a collector region. The P-type well region may be disposed proximate to remaining portions of the N+ doped buried layer and having at least a P+ doped plate corresponding to a base region and distributed segments of N+ doped plates corresponding to an emitter region.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Some example embodiments of the present invention will now be described more fully hereinafter with reference to the accompanying drawings, in which some, but not all embodiments of the invention are shown. Indeed, various example embodiments of the invention may be embodied in many different forms and should not be construed as limited to the example embodiments set forth herein; rather, these example embodiments are provided so that this disclosure will satisfy applicable legal requirements.

Some example embodiments of the present invention may provide a BCD process for providing a relatively small-sized, low-voltage structure for high-voltage ESD protection. Moreover, some example embodiments may provide such a structure having a total area smaller than a diode—BJT and MOS providing the same ESD performance. Example embodiments may also have a breakdown voltage that is near the high-voltage device operation voltage and a trigger voltage that is lower than the high-voltage device breakdown voltage. Furthermore, a relatively high holding voltage may be provided to more easily avoid latch-up occurrence than with a silicon controlled rectifier (SCR). Example embodiments may be provided, in some cases, with a standard BCD process that does not require the addition of an increased number of masks or processes.

The polysilicon used in some example embodiments may be provided via a hard mask at ion implantation to distribute parasitic devices into several groups. Example embodiments may effectively turn on multiple parasitic devices to decrease the ESD current or large electric field concentrated on the surface of the device during an ESD event. Example embodiments may also lead ESD current away from the surface into deeper junctions for effective dissipation.

The trigger voltage for example embodiments may be between the high-voltage breakdown voltage and the operation voltage. Such a trigger voltage may effectively reduce the risk of protected device or internal circuit damage before the device turns on for ESD protection during an ESD event. As such, example embodiments may provide multiple snapback and trigger and may also provide a relatively-high holding voltage. These characteristics may decrease the incidence of latch-up during normal operation. Additionally, example embodiments may not experience the field plate effect and therefore may be relatively insensitive about routing.

Figure 1:
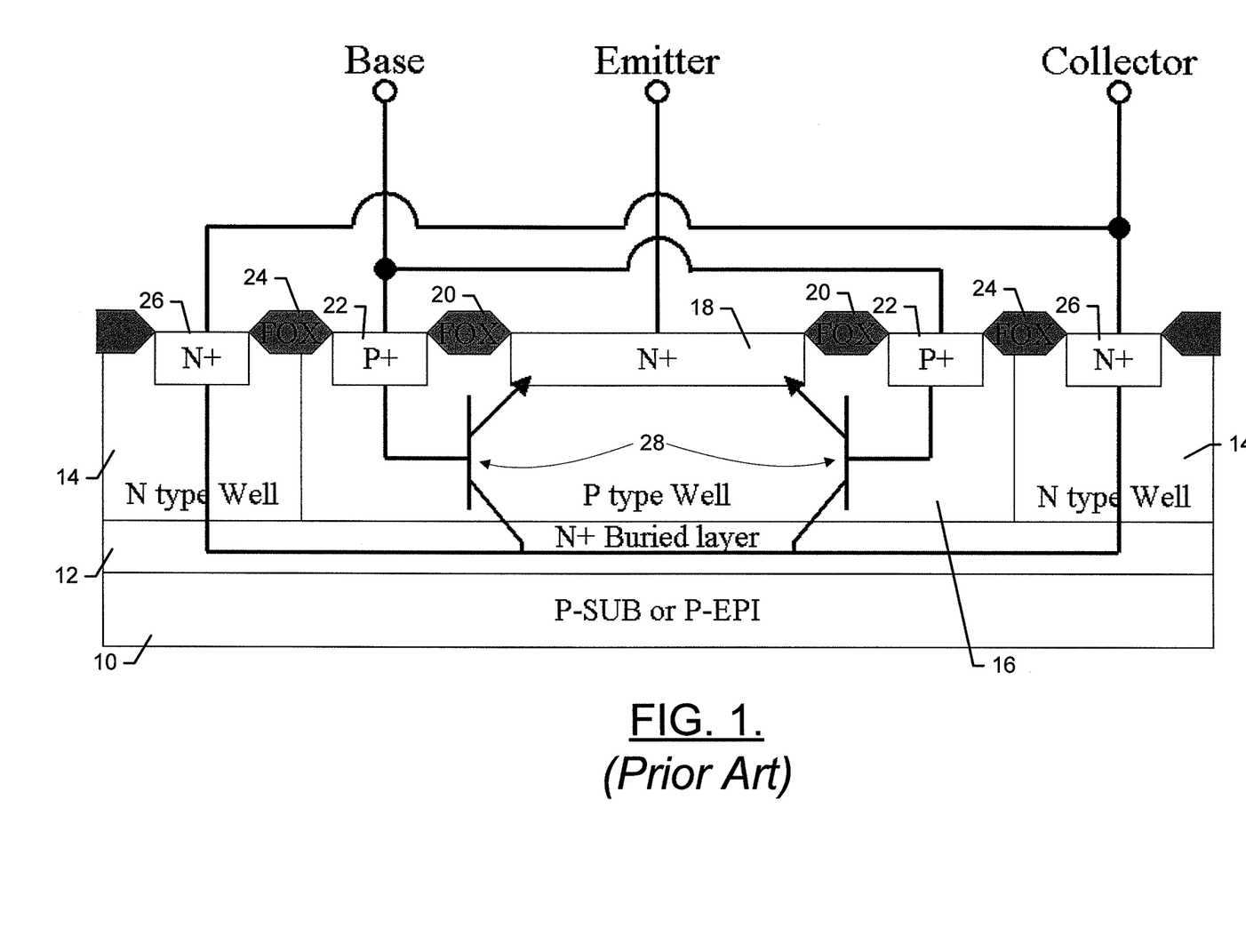
FIG. 1 illustrates a cross-sectional view of a conventional vertical bipolar junction transistor (BJT) for comparison to an example embodiment.

FIG. 1 illustrates a cross-sectional view of a conventional vertical BJT for comparison to an example embodiment. As can be seen from FIG. 1, a P-type material substrate 10 or an epitaxially-grown P-layer (P-epi) may be provided with a N+ buried layer 12 disposed thereon. An N-type well 14 may be disposed over outer edges to surround a P-type well 16. The collector of the BJT may be associated with the N-type wells 14 and the N+ buried layer 12. The emitter of the BJT may be associated with a N+ plate 18 disposed proximate to the P-type well 16. Field-oxide films (FOXs) 20 may be disposed between the N+ plate 18 and P+ plates 22 corresponding to the base of the BJT, which may be disposed on opposite sides of the N+ plate 18. FOXs 24 may also be disposed between the P+ plates 22 of the base and the N+ plates 26 associated with the collector. As can be seen from FIG. 1, two transistors 28 may be effectively formed by the provided structure. Accordingly, during an ESD event, some if not all of the stress may be distributed over the two transistors 28.

Figure 2:
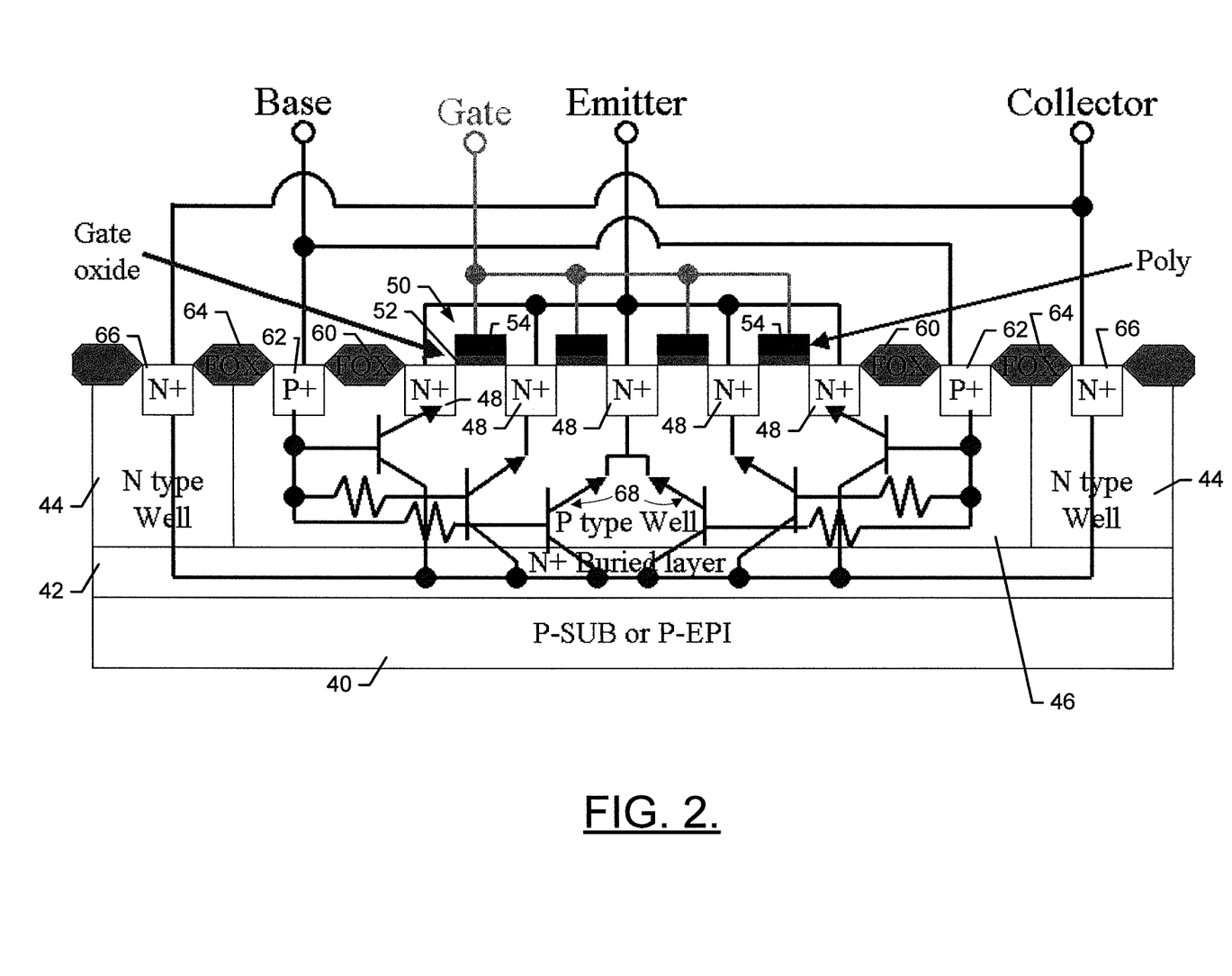
FIG. 2, illustrates a cross-sectional view of the structure of an example embodiment for providing high-voltage ESD protection.

FIG. 2 illustrates a cross-sectional view of the structure of an example embodiment for providing high-voltage ESD protection. As can be seen from FIG. 2, a P-type material substrate 40 or an epitaxially-grown P-layer (P-epi) may be provided with a N+ buried layer 42 disposed thereon. An N-type well 44 may be disposed over outer edges to surround a P-type well 46. The collector of the BJT may be associated with the N-type wells 44 and the N+ buried layer (NBL) 42. The emitter of the BJT may be associated with distributed N+ segments 48 disposed proximate to the P-type well 46. The distributed N+ segments 48 may be separated from one another by portions of the P-type well 46, and a gate 50 may be formed over the respective portions of the P-type well 46. The gate 50 formed between the distributed N+ segments 48 may include a gate oxide layer 52 and a layer of polysilicon 54, where the polysilicon 54 may be provided as a hard mask at ion implantation. The gate 50 may enable collective operation of the distributed N+ segments 48 to effectively act as a single emitter for the BJTs formed by the structure of FIG. 2.

Field-oxide films (FOXs) 60 may be disposed between and at distal ends of the distributed N+ segments 48 and P+ plates 62 corresponding to the base of the BJTs, where the P+ plates 62 may be disposed on opposite sides of the distributed N+ segments 48. FOXs 64 may also be disposed between the P+ plates 62 of the base and the N+ plates 66 associated with the collector. As can be seen from FIG. 2, multiple transistors 68 (in this example there are six) may be effectively formed by the provided structure. Accordingly, during an ESD event, the stress may be distributed over the effectively-formed transistors 68, and ESD current may be dissipated with less likelihood of encountering damage to the structure. An additional bias may therefore be provided at the gate 50 (or at the base) to provide early turn on for example embodiments so that the ESD current may be more effectively dissipated.

The material of the N+ buried layer 42 may be N-epi, a deep N-type well, or multiple, stacked N+ buried layers. The P-type well 46 may be stacked with a P-type well and P+ buried layer or a P-implant. The N-type wells 44 may also be an N-implant in some cases.

Figure 3:
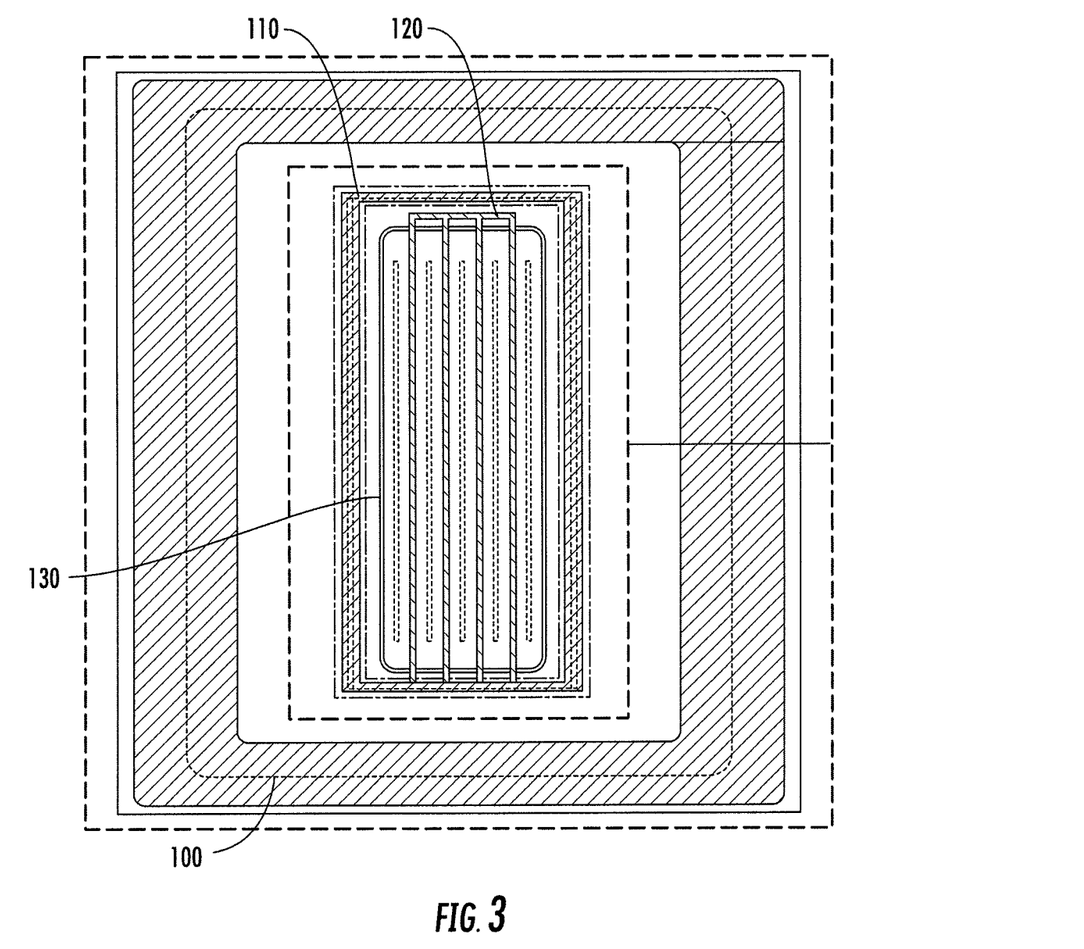
FIG. 3 illustrates a top view of an example layout for a relatively small-sized, low-voltage structure similar to the structure of FIG. 2.

FIG. 3 illustrates a top view of an example layout for a relatively small-sized, low-voltage structure similar to the structure of FIG. 2. In FIG. 3, a collector region 100 is shown at outer portions of the structure. The collector region 100 may extend around a perimeter of the structure and be spaced apart from a base region 110 by an oxide region (e.g., corresponding to FOXs 64 of FIG. 2). The base region 110 may extend around a portion of the structure in which a gate region 120 and an emitter region 130 are formed. Moreover, in some examples, the base region 110 may be concentric with the collector region 100.

The gate region 120 and the emitter region 130 may be positioned within a perimeter defined by the base region 110, but may be separated from the base region 110 by an oxide region (e.g., corresponding to FOXs 60 of FIG. 2). The gate region 120 and the emitter region 130 may be positioned proximate to each other, as shown in FIG. 3, with portions of the gate region 120 extending substantially parallel to portions of the emitter region 130 and separating the portions of the emitter region 130 into segments (e.g., to form the distributed N+ segments 48 of FIG. 2).

Figure 4:
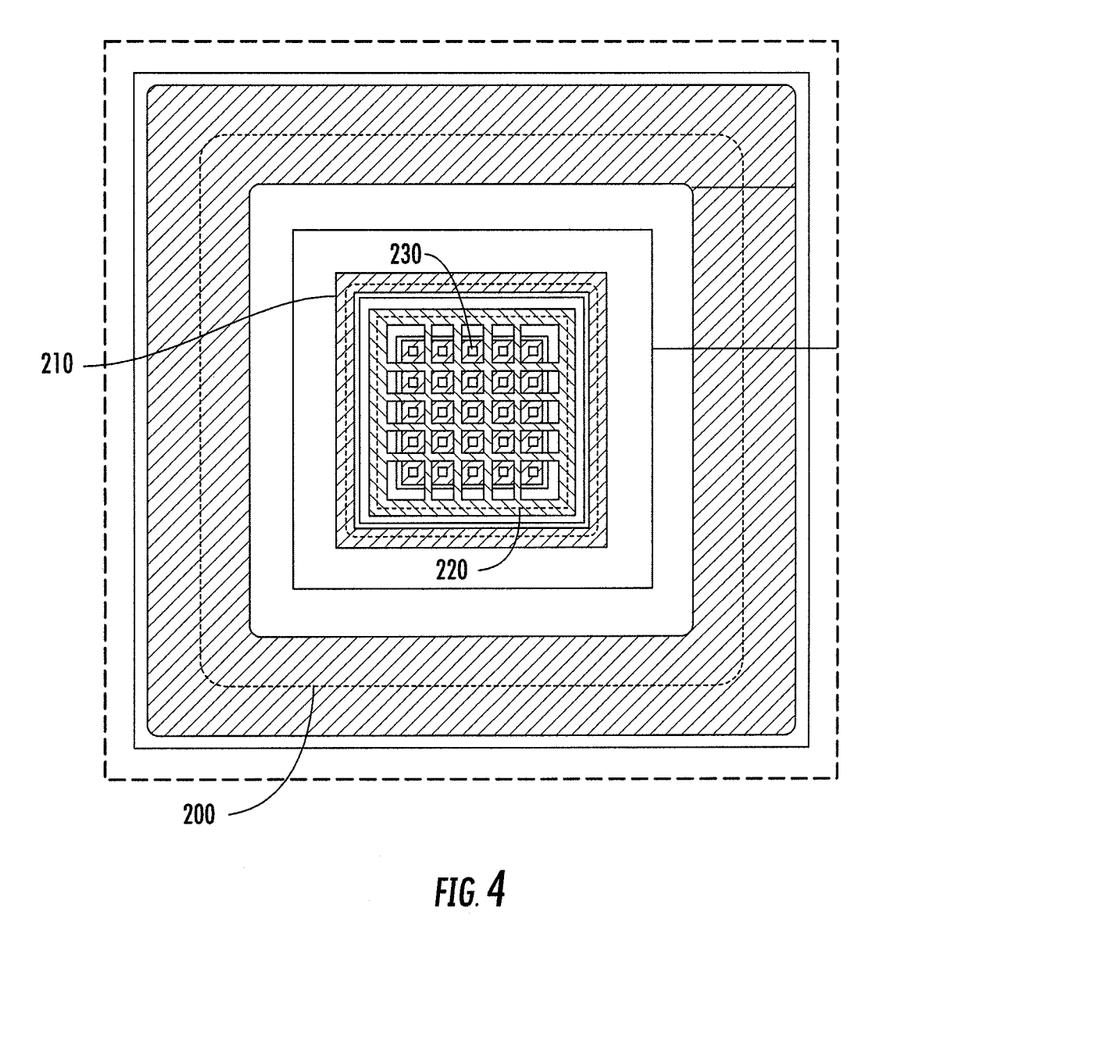
FIG. 4 illustrates a top view of an alternative example layout for a relatively small-sized, low-voltage structure similar to the structure of FIG. 2.

FIG. 4 illustrates a top view of an alternative example layout for a relatively small-sized, low-voltage structure similar to the structure of FIG. 2. In FIG. 4, a collector region 200 is shown at outer portions of the structure extending around a perimeter of the structure and spaced apart from a base region 210 by an oxide region (e.g., corresponding to FOXs 64 of FIG. 2). The base region 210 may extend around a portion of the structure in which a gate region 220 and an emitter region 230 are formed. Moreover, in some examples, the base region 210 may be concentric with the collector region 200.

The gate region 220 and the emitter region 230 may be positioned within a perimeter defined by the base region 210, but may be separated from the base region 110 by an oxide region (e.g., corresponding to FOXs 60 of FIG. 2). The gate region 220 may include a outside perimeter that is concentric with the collector region 200. In some examples, the gate region 220 and the emitter region 230 may be positioned proximate to each other, as shown in FIG. 4, with portions of the gate region 220 extending perpendicular to each other (e.g., some extending in horizontal directions and some extending in vertical directions) to define a grid structure with portions of the emitter region 230 filling the spaces between the perpendicularly extending portions of the gate region 220. As such, the emitter region 230 may be divided into a grid of columns and rows (in this example a 5×5 structure) of segments (e.g., to form the distributed N+ segments 48 of FIG. 2).

Figure 5:
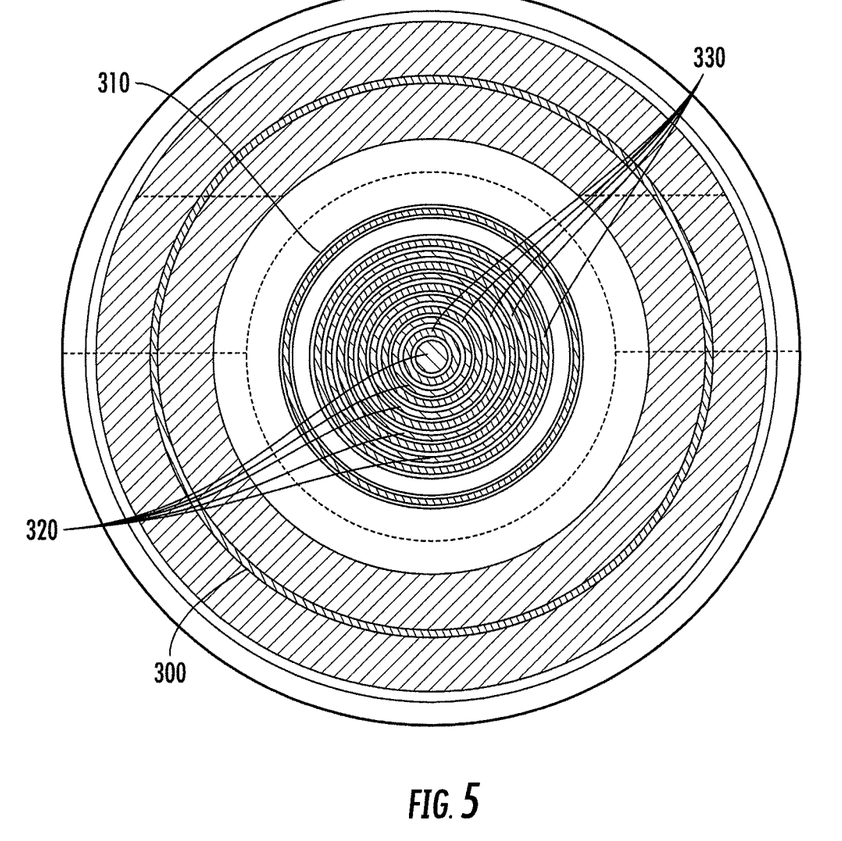
FIG. 5 illustrates yet another alternative example layout for a relatively small-sized, low-voltage structure similar to the structure of FIG. 2.

Although the shapes of the collector regions, the base regions, the gate regions and the emitter regions defined in FIGS. 3 and 4 are linear (or even square or rectangular in some cases), other shapes may be employed in some alternative embodiments. For example, FIG. 5 illustrates yet another alternative example layout for a relatively small-sized, low-voltage structure similar to the structure of FIG. 2. In FIG. 5, a collector region 300 is shown at outer portions of the structure extending around a perimeter of the structure and spaced apart from a base region 310 by an oxide region (e.g., corresponding to FOXs 64 of FIG. 2). The base region 310 may extend around a portion of the structure in which a gate region 320 and an emitter region 330 are formed. Each of the collector region 300, the base region 310, the gate region 320 and the emitter region 330 has a circular shape and all of the circles are concentric in this example.

The gate region 320 and the emitter region 330 may be positioned within a perimeter defined by the base region 310, but may be separated from the base region 310 by an oxide region (e.g., corresponding to FOXs 60 of FIG. 2). The gate region 320 and the emitter 330 may each include multiple circular portions that alternate such that each circular portion (or ring) of the emitter region 330 may be separated from a next circular portion (or ting) of the emitter region 330 by a respective circular portion (or ring) of the gate region 320 to form separate rings of the emitter region that correspond to the segments of the distributed N+ segments 48 of FIG. 2.

Figure 6:
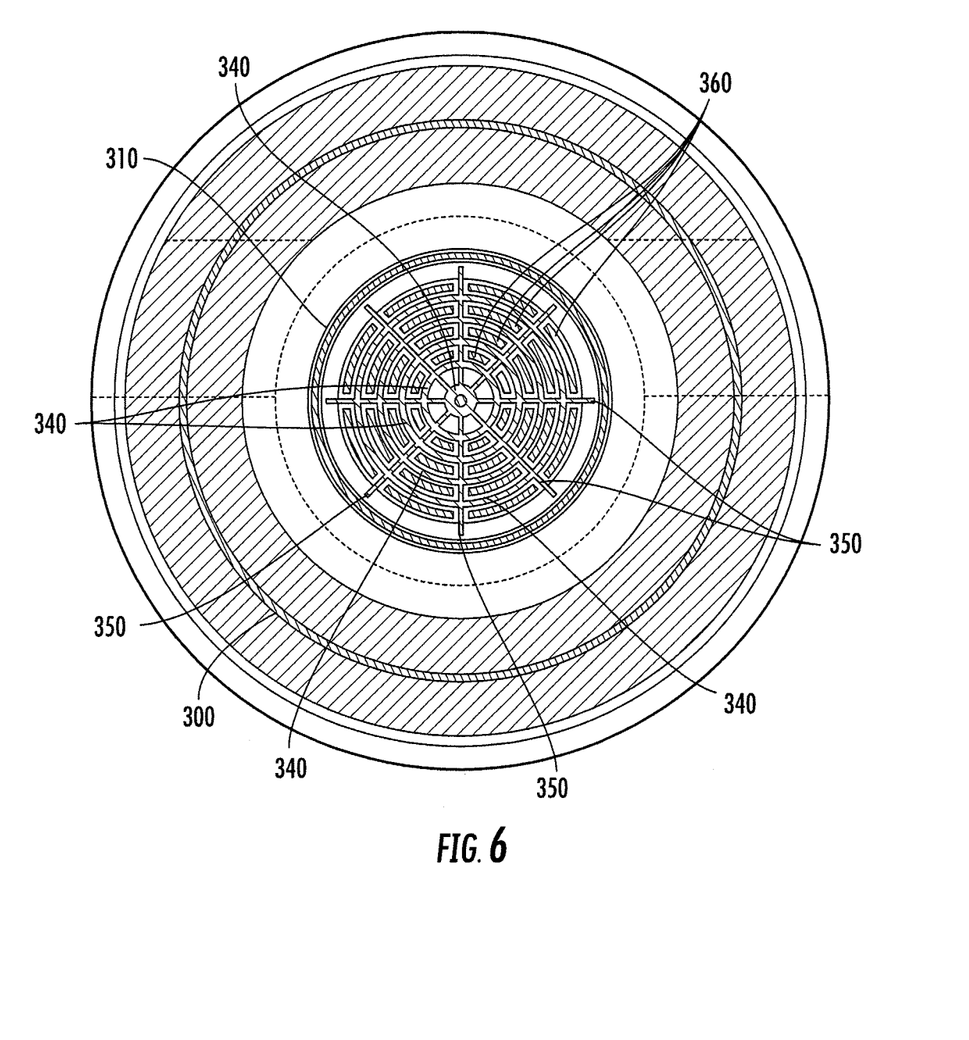
FIG. 6 illustrates yet another alternative structure that is similar to the structure of FIG. 5 except that the gate region 340 of FIG. 6 is not circular.

FIG. 6 illustrates yet another alternative structure that is similar to the structure of FIG. 5 except that the gate region of FIG. 6 is not entirely circular. In FIG. 6, for example, the gate region includes circular portions 340 that are positioned and shaped similarly to the rings of the gate region 320 of FIG. 5 and bisecting lines 350. As such, circular portions of the emitter region 360 of FIG. 6 (which are generally structured similarly to the rings of the emitter region 330 of FIG. 5) are further divided by the series of bisecting lines 350 that pass through a center of the structure and have substantially equal angular separation from each other. The bisecting lines 350 further divide the emitter region 360 into more segments (e.g., corresponding to the distributed N+ segments 48 of FIG. 2).

Figure 7:
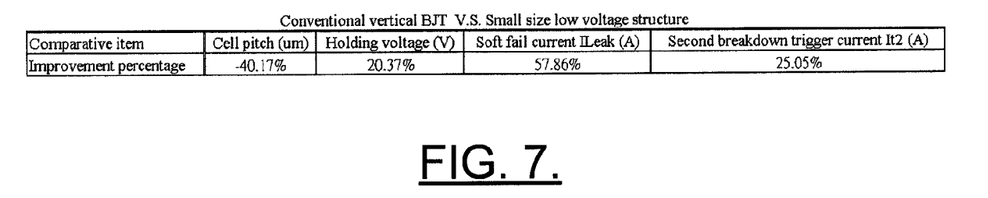
FIG. 7 illustrates a table comparing cell pitch, holding voltage, soft fail current leakage, and second breakdown trigger current for an example embodiment to a conventional vertical BJT according to one experiment.

FIG. 7 illustrates a table comparing cell pitch, holding voltage, soft fail current leakage, and second breakdown trigger current for an example embodiment to a conventional vertical BJT according to one experiment. As can be seen from FIG. 7, experimental data associated with one example embodiment had about 40% smaller cell pitch, while improving holding voltage by about 20%, soft fail current leakage by about 58% and second breakdown trigger current by about 25%.

Example embodiments may therefore provide a relatively small-sized low-voltage structure for high-voltage ESD protection. Moreover, example embodiments may be applied to a standard BCD process without a requirement for use of additional masks. Embodiments may also be applied to different high-voltage BCD processes and provide different operational voltage related ESD protection in the same process by providing a N+ buried layer or N-type well recipe. As such, high-voltage ESD protection that is often required for devices that are to be used in high-voltage settings that may encounter ESD events can be provided in a relatively small size and by a relatively low-voltage MOS structure. Some embodiments could also be used for general DC circuit operation.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An electrostatic discharge (ESD) protected device comprising:
    a substrate;
    an N+ doped buried layer disposed proximate to the substrate, and including first and second portions;
    an N-type well region disposed proximate to the first portion of the N+ doped buried layer to form a collector region; and
    a P-type well region disposed proximate to the second portion of the N+ doped buried layer, the P-type well region having at least a P+ doped plate corresponding to a base region, and distributed segments of N+ doped plates corresponding to an emitter region,
    wherein the distributed segments of N+ doped plates are separated from each other by respective portions of the P-type well and a respective gate structure is disposed proximate each respective portion of the P-type well.

2. The ESD protected device of claim 1, wherein the N-type well region includes two portions disposed on opposite sides of the P-type well region.

3. The ESD protected device of claim 1, wherein the gate structures each include a gate oxide and polysilicon enabling provision of a bias signal to thereby enable early turn on of the device for ESD protection due to ESD current dissipation over distributed effective transistors.

4. The ESD protected device of claim 1, wherein the collector region and the base region are concentric geometric shapes.

5. The ESD protected device of claim 4, wherein the collector region, the base region, the emitter region and a gate region disposed between portions of the emitter region to form the distributed segments of N+ doped plates are concentric circles.

6. The ESD protected device of claim 4, wherein the collector region, the base region, and the emitter region are concentric circles and a gate region is defined by lines radially extending through a center of the emitter region with substantially equal angular separation therebetween to form the distributed segments of N+ doped plates.

7. The ESD protected device of claim 4, further comprising portions of the P-type well that divide the emitter region into the distributed segments of N+ doped plates, wherein the collector region and the base region enclose the respective portions of the P-type well.

8. The ESD protected device of claim 7, wherein said portions comprise a plurality of linearly extending portions disposed between and parallel to respective linearly extending portions of the emitter region, the portions dividing the emitter region into the distributed segments of N+ doped plates.

9. The ESD protected device of claim 7, wherein the gate region comprises a grid-like arrangement including a plurality of linearly extending portions, a first group of the linearly extending portions being disposed substantially perpendicular to a second group of the linearly extending portions to divide the emitter region into the distributed segments of N+ doped plates formed in columns and rows within the grid-like arrangement.

10. The ESD protected device of claim 1, wherein the N-type well region includes N-implant material.

11. The ESD protected device of claim 1, wherein the P-type well region comprises a P-type well stacked with a P+ buried layer or a P-implant.

12. The ESD protected device of claim 1, wherein the N+ doped buried layer comprises epitaxially formed N-type material or a deep N-type well.

13. The ESD protected device of claim 1, wherein the N+ doped buried layer comprises multiple stacked N+ buried layers.

14. The ESD protected device of claim 1, wherein the distributed segments of N+ doped plates are each associated with a respective one of a plurality of separate ESD current dissipation paths.

15. An electrostatic discharge (ESD) protected device comprising:
a substrate;
an N+ doped buried layer disposed proximate to the substrate, and including first and second portions;
an N-type well region disposed proximate to the first portion of the N+ doped buried layer to form a collector region;
a P-type well region disposed proximate to the second portion of the N+ doped buried layer, the P-type well region having at least a P+ doped plate corresponding to a base region, and distributed segments of N+ doped plates corresponding to an emitter region, wherein the distributed segments of N+ doped plates are each associated with a respective one of a plurality of separate ESD current dissipation paths; and
a gate disposed between each of the distributed segments of N+ doped plates to enable early turn on of each respective one of the plurality of separate ESD current dissipation paths during an ESD event.

16. An electrostatic discharge (ESD) protected device comprising:
a substrate;
an N+ doped buried layer disposed proximate to the substrate, and including first and second portions;
an N-type well region disposed proximate to the first portion of the N+ doped buried layer to form a collector region; and
a P-type well region disposed proximate to the second portion of the N+ doped buried layer, the P-type well region having at least a P+ doped plate corresponding to a base region, and distributed segments of N+ doped plates corresponding to an emitter region, wherein the distributed segments of N+ doped plates are separated from each other by respective portions of the P-type well, wherein a respective gate structure is disposed proximate each respective portion of the P-type well.

17. The ESD protected device of claim 16, wherein the gate structures each include a gate oxide and polysilicon enabling provision of a bias signal to thereby enable early turn on of the device for ESD protection due to ESD current dissipation over distributed effective transistors.

* * * * *